United States Patent [19]
Yamada et al.

[11] Patent Number: 5,077,588
[45] Date of Patent: Dec. 31, 1991

[54] MULTIPLE WAVELENGTH LIGHT EMITTING DEVICE

[75] Inventors: Masato Yamada; Takuo Takenaka, both of Annaka; Yukihiro Yamaguchi, Gunma, all of Japan

[73] Assignee: Shin-Etsu Handotai Co., Ltd., Tokyo, Japan

[21] Appl. No.: 589,796

[22] Filed: Sep. 28, 1990

[30] Foreign Application Priority Data

Sep. 29, 1989 [JP] Japan .............................. 1-252435
Oct. 13, 1989 [JP] Japan .............................. 1-264898

[51] Int. Cl.$^5$ .......................................... H01L 33/00
[52] U.S. Cl. ............................... 357/17; 357/16; 357/4; 372/43
[58] Field of Search ............ 357/17, 16, 4; 372/43, 372/45, 46, 44

[56] References Cited

U.S. PATENT DOCUMENTS 4,280,107 7/1981 Scifres et al. ............... 357/17 X
4,313,125 1/1982 Hartman et al. ............. 357/17
4,347,611 8/1982 Scifres et al. ............... 357/17 X
4,864,369 9/1989 Snyder et al. ............... 357/17

Primary Examiner—William Mintel
Attorney, Agent, or Firm—Whitham & Marhoefer

[57] ABSTRACT

A multiple wavelength light emitting device having a single p-n junction and at least two light emitting layers within a diffusion region of a minority carrier comprises a p-type $Ga_{1-x_1}Al_{x_1}As$ layer, a p-type $Ga_{1-x_2}Al_{x_2}As$ layer, a p-type $Ga_{1-x_3}Al_{x_3}As$ layer, and an n-type $Ga_{1-y}Al_yAs$ layer, where $x_1$, $x_2$, $x_3$ and $Y$ represent aluminum arsenide mixed crystal ratios of the respective layers. The light emitting alyers, i.e., the p-type $Ga_{1-x_2}Al_{x_2}As$ layer and the p-type $Ga_{1-x_3}Al_{x_3}As$ layer each have a different band gap to emit an infrared light and a visible light, respectively. Since the infrared and ivsible lights are simultaneously emitted, emission of the infrared light can be confirmed or monitored by the visible light. The light emitting device of the present invention utilizes an energy well for trapping electrons and an energy barrier for preventing electrons from diffusing to improve the whole light emitting efficiency.

9 Claims, 3 Drawing Sheets n-region    p-region n-region    p-region

MULTIPLE WAVELENGTH LIGHT EMITTING DEVICE

BACKGROUND OF THE INVENTION

This invention relates to a multiple wavelength light emitting device incorporated into with a single p-n junction which is capable of simultaneously emitting lights having different light emitting wavelengths from one another.

A multiple color light emitting device can emit a plurality of color lights simultaneously or each of them individually, and for reasons of this convenience it is used for photo-electric switches and the like. Recently, as an infrared light is increasingly employed in many applications, taking advantage of its invisibility, a demand for infrared light emitting devices made of compound semiconductor is also being increased.

Since a light emitted by such infrared light emitting device belongs to an infrared region or an invisible region, it is difficult to determine by view whether or not the device is malfunctioning, which gives rise to a problem in maintaining the performance of an electronic apparatus which employs such infrared light emitting device.

A compound semiconductor device which can emit an infrared light and a visible light is disclosed, for example, by Japanese Kokai No. 57-28371. This prior art proposes a multiple color light emitting device which comprises a first p-n junction formed of an n-type $Ga_xAl_{1-x}As$ crystal layer and a p-type $Ga_xAl_{1-x}As$ crystal layer epitaxially grown on a surface of an n-type GaAs crystal substrate, and a second p-n junction formed by diffusing impurities in the n-type $Ga_xAl_{1-x}As$ crystal layer exposed by removing at least a portion of the n-type GaAs crystal substrate, wherein these two p-n junctions are utilized to emit the above-mentioned infrared light and visible light.

However, for manufacturing a device which can emit two kinds of lights, i.e., a red light and an infrared light on the basis of the multiple color light emitting device constructed as mentioned above, it is necessary to form two p-n junctions, in a $Ga_xAl_{1-x}As$ crystal layer, oriented in opposite directions to one another by forming an epitaxially grown n-type $Ga_xAl_{1-x}As$ crystal layer, diffusing Zn in the surface of the grown layer to form a p-type layer, and removing the GaAs crystal substrate to form another p-type layer on the back surface of the grown layer. Thus, the manufacturing process for such device having two p-n junctions is quite complicated. In addition, the prior art device requires adjustment of respective bias currents for red and infrared lights when they are simultaneously emitted, thereby making it difficult to employ a visible red light as a monitor for emission of an infrared light.

Another prior art example of a single light emitting device made of compound semiconductor which can emit an infrared light and a visible light is disclosed by Japanese Kokai No. 57-41979. This device makes use of the fact that the diffusion length of injected electrons from an n-region to a p-region in a light emitting diode made of GaAs doped with Si is sufficiently long. An n-type (doped with Si) GaAs mono-crystal layer, a p-type GaAs mono-crystal layer and a p-type GaAlAs mixed-crystal layer are grown on a GaAs substrate, wherein an infrared light is emitted from the GaAs mono-crystal layer, or a first p-type layer in a high current bias region, while a visible light determined by the forbidden band of the materials constituting the layer, for example, a red light is emitted from the GaAlAs mixed-crystal layer or a second p-type layer in the same manner.

However, the above light emitting device has a drawback in that electrons injected from the n-type layer almost recombine in the first p-type layer and therefore do not diffuse and recombine in the second p-type layer. Even if electrons recombine in the second p-type GaAlAs mixed-crystal layer to achieve light emission, the light is self-absorbed. Thus, its internal light emitting efficiency is quite low.

OBJECTS AND SUMMARY OF THE INVENTION

In view of the problems mentioned above, it is an object of the present invention to provide an economical multiple wavelength light emitting device having a single p-n junction which is capable of simultaneously emitting multiple color lights, specifically a red light and an infrared light, with a single forward direction bias current, wherein the red light is utilized as a monitor for emission of the infrared light.

It is another object of the present invention to provide a multiple wavelength emitting light emitting device which has a high light emitting efficiency with respect to both infrared and visible lights.

It is a further object of the present invention to provide a multiple wavelength light emitting device which is capable of arbitrarily changing a light emitting ratio of infrared and visible lights.

To achieve the above object, the present invention provides a multiple wavelength light emitting device having a single p-n junction and at least two light emitting layers within a diffusion region of a minority carrier comprising:

a p-type $Ga_{1-x1}Al_{x1}As$ layer;
a p-type $Ga_{1-x2}Al_{x2}As$ layer;
a p-type $Ga_{1-x3}Al_{x3}As$ layer; and
an n-type $Ga_{1-y}Al_yAs$ layer, where $x_1$, $x_2$, $x_3$ and Y represent aluminum arsenide mixed crystal ratios of the respective layers and they are related with each other in the special relationships according to the present invention.

The above and other objects, features and advantages of the present invention will become apparent from the following detailed description taken in conjunction with the accompanying drawings in which preferred embodiments of the present invention are shown by way of illustrative examples.

DETAILED DESCRIPTION OF THE PREFERRED EMBODIMENTS

Figure 1:
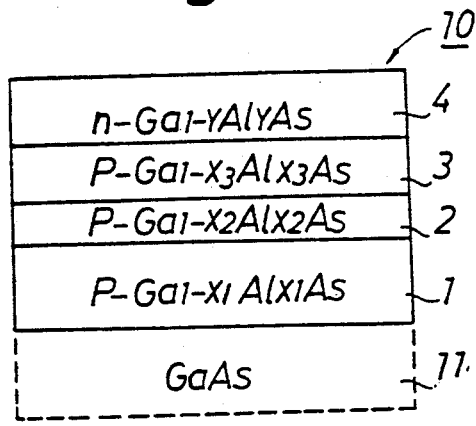
FIG. 1 is a cross-sectional view showing a structure of a multiple wavelength light emitting device according to the present invention.

A first embodiment of the present invention will be hereinafter explained with reference to FIGS. 1 through 4. FIG. 1 shows a structure of a multiple wavelength light emitting device 10 which has three p-type layer 1, 2 and 3 and an n-type layer 4 as epitaxially grown layers deposited on a GaAs mono-crystal substrate 11.

The multiple wavelength light emitting device 10 of FIG. 1 is formed by epitaxially growing a p-type $Ga_{0.3}Al_{0.7}As$ layer 1, a double-hetero type light emitting layer, i.e. a p-type $Ga_{0.95}Al_{0.05}As$ layer 2, a single-hetero type light emitting layer, i.e. a p-type $Ga_{0.62}Al_{0.38}As$ layer 3, and an n-type $Ga_{0.3}Al_{0.7}As$ layer 4 sequentially on the GaAs mono-crystal substrate 11. It should be noted that the substrate 11 is removed by etching after the layers are completely grown. As can be seen, the multiple wavelength light emitting device 10 solely has a single p-n junction, and the p-type light emitting layer 2 and 3 are formed in a minority carrier diffused region.

The p-type $Ga_{0.3}Al_{0.7}As$ layer 1 is a layer having a thickness of 150 $\mu m$ in which Zn is doped in a concentration of $2 \times 10^{17}/cm^3$, the p-type $Ga_{0.95}Al_{0.05}As$ layer 2 a layer having a thickness of 1 $\mu m$ in which Zn is doped in a concentration of $1 \times 10^{17}/cm^3$, the p-type $Ga_{0.62}Al_{0.38}As$ layer 3 a layer having a thickness of 5 $\mu m$ in which Zn is doped in a concentration of $1 \times 10^{18}/cm^3$, and the n-type $Ga_{0.3}Al_{0.7}As$ layer 4 a layer having a thickness of 50 $\mu m$ in which Te is doped in a concentration of $1 \times 10^{17}/cm^3$.

In the p-type grown layers 1, 2 and 3, a diffusion length over which electrons diffuse beyond the p-n junction is 30 $\mu m$. With this value the $Ga_{0.62}Al_{0.38}As$ layer 3 requires the above-mentioned thickness of approximately 5 $\mu m$ and a hole concentration of approximately $1 \times 10^{18}/cm^3$ to emit a light with a practical intensity.

Generally, the p-type $Ga_{0.95}Al_{0.05}As$ layer 2 has the highest emission efficiency when its length is approximately 1 $\mu m$, taking account of self-absorption and the like.

It is preferable that the thickness of the $Ga_{0.3}Al_{0.7}As$ layer 1 ranges from 100 to 150 $\mu m$ in order to facilitate handling when the GaAs crystal substrate 11, which undesirably performs as an emitted light absorbing layer if remains, is removed. Further, the thickness of the n-type $Ga_{0.3}Al_{0.7}As$ layer 4 preferably has a thickness of more than 40 $\mu m$, taking account of its emission efficiency.

Assuming that an Al mixed crystal ratio of the layers 1, 2, 3 and 4 are $x_1$ (=0.7), $x_2$ (=0.05), $x_3$ (=0.38) and Y (=0.7), the following relationships are satisfied among $x_1$, $x_2$, $x_3$ and Y:

$$Y > x_3 > x_2 \quad (1)$$

$$x_1 > x_3 \quad (2)$$

Figure 2:
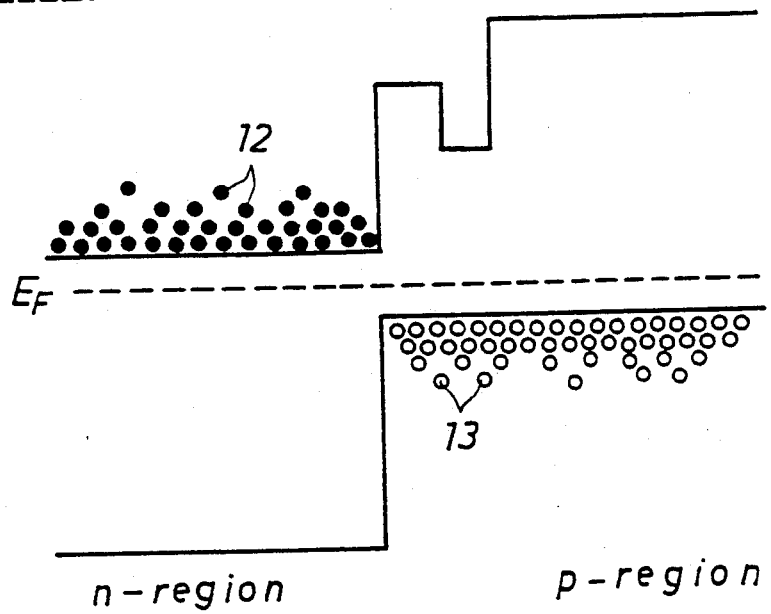
FIGS. 2 and 3 are diagrams respectively showing an energy band structure before and after applying a forward direction bias current to a first embodiment of the light emitting device of the present invention.

Therefore, the energy band structure of the multiple wavelength light emitting device 10 is as shown in FIG. 2, in which a thermal equilibrium condition is maintained where electrons 12 in an n-region and holes 13 in a p-region do not diffuse. Incidentally, reference letters $E_F$ in FIG. 2 designate the Fermi level.

Thus, when a forward direction bias current is applied to the light emitting device 10, electrons 12 are injected from the n-region to the p-region and recombine with holes 13 in the p-region, with the result that the light emitting layers 2 and 3 emit infrared and red lights, respectively.

Since the relationship of the AlAs mixed crystal ratios $x_1$, $x_2$, $x_3$ and Y of the layers 1, 2, 3 and 4 are determined by the above expressions (1) and (2), band gaps $e_1$, $e_2$, $e_3$ and $e_4$ of the respective layers 1–4 are $e_1 = 2.1$ eV, $e_2 = 1.5$ eV, $e_3 = 1.8$ eV and $e_4 = 2.1$ eV, respectively.

Figure 3:
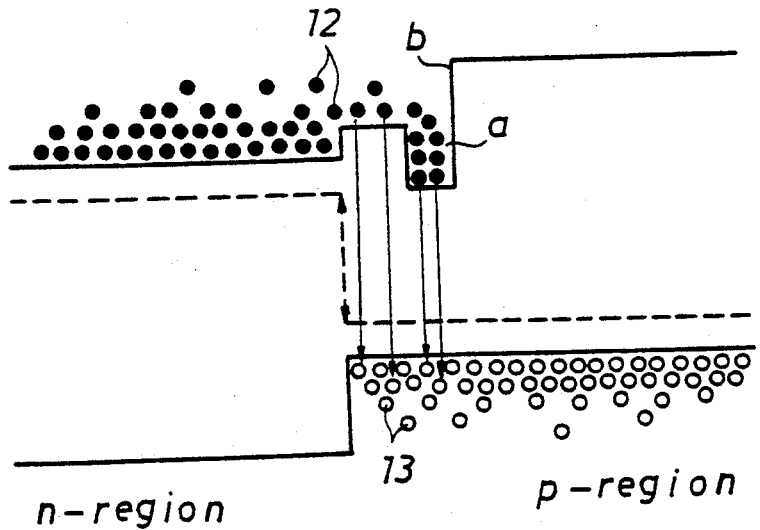

The p-type $Ga_{0.95}Al_{0.05}As$ layer 2 has its aluminum arsenide mixed crystal ratio smaller than that of the $Ga_{0.62}Al_{0.38}As$ layer 3, so that an energy well a is formed as shown in FIG. 3, whereby the injected electrons 12 are trapped in the well. The injected electrons 12 which have passed through the p-type $Ga_{0.95}Al_{0.05}As$ layer 2 reach the p-type $Ga_{0.62}Al_{0.38}As$ layer 3. However, as mentioned above, the band gap of this layer is chosen to be larger than that of the layer 2, whereby an energy barrier b is formed, as shown in FIG. 3, which prevents the electrons 12 from passing beyond same. As a result, an electron density in the p-type $Ga_{0.95}Al_{0.05}As$ layer 2 becomes higher, making it possible to emit a strong infrared light, corresponding to the band gap of the layer 2.

Figure 4:
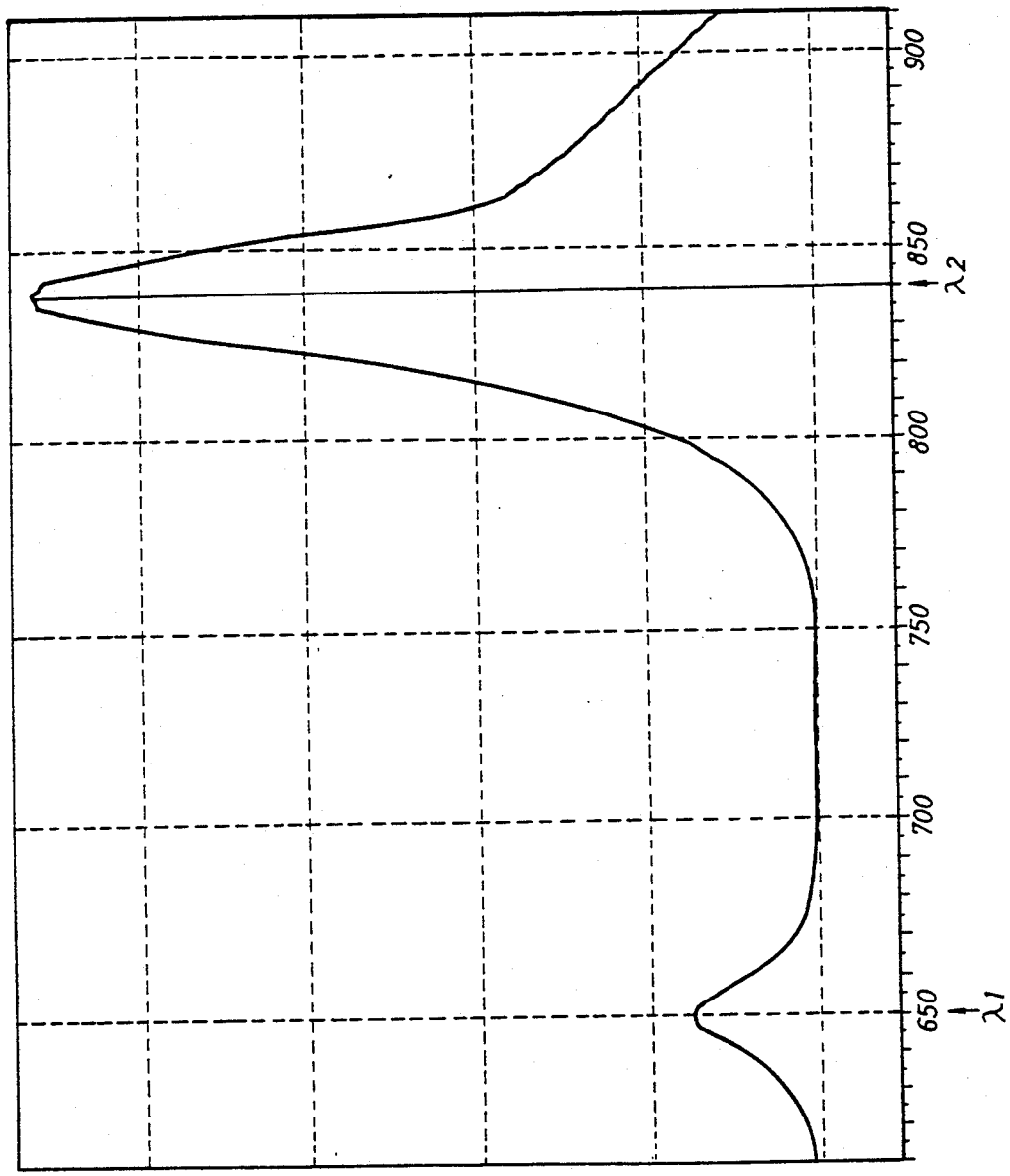
FIG. 4 is a diagram showing an emission spectrum of the light emitting device of the present invention.

Thus, the light emitting layer 2 ($e_2 = 1.5$ eV) emits a red light which has a shorter wavelength, while the light emitting layer 3 ($e_3 = 1.8$ eV), having a smaller band gap, emits an infrared light which has a longer wavelength. The emission spectrum of these red and infrared lights is shown in FIG. 4 from which it can be seen that peak values of the wavelength of the respective lights are $\lambda_1 = 650$ nm and $\lambda_2 = 840$ nm.

The p-type $Ga_{0.95}Al_{0.05}As$ layer 2 together with the two compound semiconductor layers 1, 3 on the both side of the layer 2, respectively having a large band gap, constitute a double hetero structure by which the infrared light emitted from the p-type $Ga_{0.95}Al_{0.05}As$ layer 2 is never absorbed, with the result that the external emitting efficiency of the light emitting device 10 is largely improved.

The red light emitted from the p-type $Ga_{0.62}Al_{0.38}As$ layer 3 may be absorbed by the p-type $Ga_{0.95}Al_{0.05}As$ layer 2. However, a single hetero structure constituted by the n-type $Ga_{0.3}Al_{0.7}As$ layer 4 and the compound semiconductor layer having a larger band gap than the layer 3, i.e., the layer 1, prevents the red light from being absorbed, whereby a highly efficient red light emission can be achieved.

Figure 5:
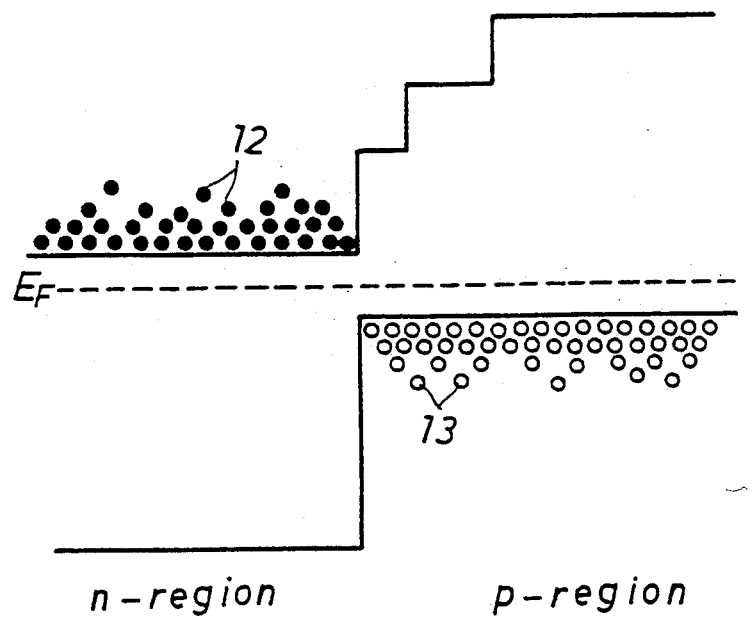
FIGS. 5 and 6 are diagrams respectively showing an energy band structure before and after applying a forward direction bias current to a second embodiment of the present invention.

Next, a second embodiment of the present invention will be explained with reference to FIGS. 5 through 6 in which parts corresponding to those of the first embodiment are designated the same reference numerals and detailed explanation thereof will be omitted.

In the second embodiment, layers epitaxially grown on the GaAs mono-crystal substrate 11 (see FIG. 1) are a p-type $Ga_{0.3}Al_{0.7}As$ layer 1, a p-type $Ga_{0.62}Al_{0.38}As$ layer 2, a p-type $Ga_{0.95}Al_{0.05}As$ layer 3 and an n-type $Ga_{0.3}Al_{0.7}As$ layer 4.

The layers 1, 2 and 4 have the same thickness and dopant density as those of the first embodiment, while the p-type $Ga_{0.95}Al_{0.05}As$ layer 3 a layer having a thickness of 1 $\mu m$ in which Zn is doped in a density of $1 \times 10^{17}/cm^3$. It should be noted that the thickness of the layers 2 and 3 preferably ranges from 1 to 2 $\mu m$ in consideration of self-absorption of the lights emitted therefrom.

In the second embodiment, the AlAs mixed crystal ratios $x_1$, $x_2$, $x_3$ and Y of the layers 1, 2, 3 and 4 are chosen to be 0.7, 0.38, 0.05 and 0.7, respectively. Therefore, the following relationships are satisfied among $x_1$, $x_2$, $x_3$ and Y:

$$Y > x_2 > x_3 \quad (3)$$

$$x_1 > x_2 \quad (4)$$

Figure 6:
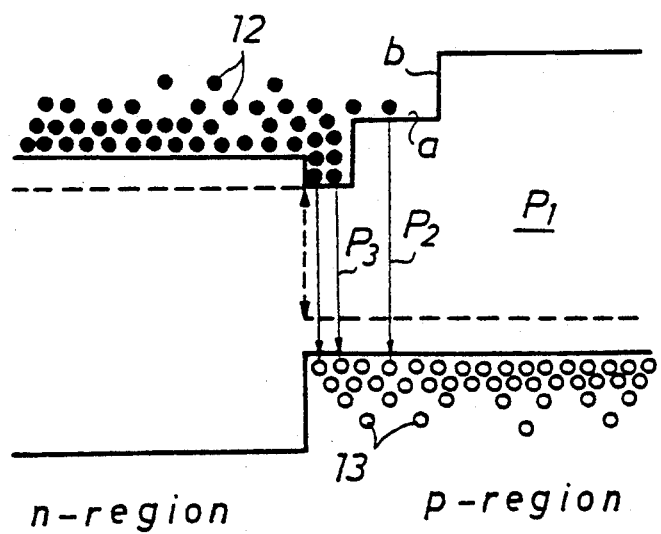

Thus, the energy band structure of the multiple wavelength light emitting device of the second embodiment is as shown in FIG. 6 where a thermal equilibrium condition is maintained in the same manner as the first embodiment.

When a forward direction bias current is applied to the light emitting device 10, electrons 12 are injected from an n-region to a $p_3$-region and recombine with holes 13 existing in the p-region, whereby the light emitting layer 3 emits an infrared light. When the applied bias voltage is further increased, the electrons 12 from the $p_3$-region are injected into a $p_2$-region and recombine with the hole 13, whereby a red light is emitted from the light emitting layer 2. In this event, the electrons 12 injected into the $p_2$-region is prevented from diffusing in the $p_1$-region by the band gap of same.

Since the relationship among the AlAs mixed crystal ratios $x_1$, $x_2$, $x_3$ and Y of the layers 1, 2, 3 and 4 are determined by the above expressions (3) and (4), band gaps $e_1$, $e_2$, $e_3$ and $e_4$ of the respective layers 1–4 are $e_1 = 2.1$ eV, $e_2 = 1.8$ eV, $e_3 = 1.5$ eV and $e_4 = 2.1$ eV, respectively.

As a result, high potential barriers a and b for blocking the electrons 12 injected in the $p_2$ and $p_3$ regions are formed as shown in FIG. 6. The light emitting layer 2 which has a larger band gap ($e_2 = 1.8$ eV) emits a red light having a shorter wavelength, while the light emitting layer 3 which has a smaller band gap ($e_3 = 1.5$ eV) emits an infrared light having a longer wavelength. The emission spectrum of these lights is the same as the first embodiment as shown in FIG. 4.

The potential barrier a which blocks the electrons 12 injected in the $p_3$-region, together with a double-hetero structure formed by the n-type $Ga_{0.3}Al_{0.7}As$ layer 4 effectively improve the light emitting efficiency.

As described above, the electrons 12 overflowed by a higher bias voltage are injected into the layer 2. The high potential barrier b is formed by the $p_1$-region within the diffusion length of the thus injected electrons 12, whereby the diffusion length of the electrons 12 injected into the $p_2$-region is substantially shortened. The diffusion length thus shortened and an additional window effect can further improve the red light emitting efficiency of the light emitting device 10.

As explained above in detail, the present invention provides a quite simple structure of the multiple wavelength light emitting device 10 which solely has a single p-n junction, and accordingly the epitaxial and device processes in a manufacturing procedure can be quite simple.

Further, since the light emitting device of the present invention can simultaneously emit an infrared light and a visible light, emission of the infrared light can be confirmed or monitored by the visible light, so that the light emitting device 10, if applied to a security apparatus, can improve the reliability of same.

Also, the light emitting device of the present invention, which utilizes an energy well for trapping electrons and an energy barrier for preventing electrons from diffusing as described above, can improve the whole light emitting efficiency in comparison with conventional devices which do not have such energy band structure.

Furthermore, the light emitting device of the present invention can also improve the external light emitting efficiency by virtue of the window effect.

Since many changes could be made in the above construction and many apparently widely differing embodiments of the present invention could be made without departing from the scope thereof, it is intended that all matter contained in the above description or shown in the accompanying drawings shall be interpreted as illustrative and not in a limiting sense.

What is claimed is:

1. A multiple wavelength light emitting device having a single p-n junction and at least two light emitting layers within a minority carrier diffusion region comprising:

a p-type $Ga_{1-x_1}Al_{x_1}As$ layer;
   a p-type $Ga_{1-x_2}Al_{x_2}As$ layer;
   a p-type $Ga_{1-x_3}Al_{x_3}As$ layer; and
   an n-type $Ga_{1-y}Al_yAs$ layer, where $X_1$, $X_2$, $X_3$ and Y represent aluminum arsenide mixed crystal ratios of the respective layers, wherein said aluminum arsenide mixed crystal ratios of the respective layers satisfy the following expression:

$$Y > X_3 > X_2$$

and $$X_1 > X_3.$$

2. A multiple wavelength light emitting device having a single p-n junction and at least two light emitting layers within a minority carrier diffusion region comprising:

a p-type $Ga_{1-x_1}Al_{x_1}As$ layer;
   a p-type $Ga_{1-x_2}Al_{x_2}As$ layer;
   a p-type $Ga_{1-x_3}Al_{x_3}As$ layer; and
   an n-type $Ga_{1-y}Al_yAs$ layer, where $X_1$, $X_2$, $X_3$ and Y represent aluminum arsenide mixed crystal ratios of the respective layers, wherein said aluminum arsenide mixed crystal ratios of the respective layers satisfy the following expressions:

$$Y > X_2 > X_3$$

and $$X_1 > X_2.$$

3. A multiple wavelength light emitting device having a single p-n junction and at least two light emitting layers within a minority carrier diffusion region comprising:

a p-type $Ga_{1-x_1}Al_{x_1}As$ layer;
   a p-type $Ga_{1-x_2}Al_{x_2}As$ layer;
   a p-type $Ga_{1-x_3}Al_{x_3}As$ layer; and
   an n-type $Ga_{1-y}Al_yAs$ layer, where $X_1$, $X_2$, $X_3$ and Y represent aluminum arsenide mixed crystal ratios of the respective layers, wherein said p-type $Ga_{1-x_2}Al_{x_2}As$ layer and said p-type $Ga_{1-x_3}Al_{x_3}As$ layer are light emitting layers, respectively, having a different band gap.

4. A multiple wavelength light emitting device having a single p-n junction and at least two light emitting layers within a minority carrier diffusion region comprising:
- a p-type $Ga_{1-X_1}Al_{X_1}As$ layer;
- a p-type $Ga_{1-X_2}Al_{X_2}As$ layer;
- a p-type $Ga_{1-X_3}Al_{X_3}As$ layer; and
- an n-type $Ga_{1-Y}Al_YAs$ layer, where $X_1$, $X_2$, $X_3$ and $Y$ represent aluminum arsenide mixed crystal ratios of the respective layers, wherein said p-type $Ga_{1-X_1}Al_{X_1}As$ layer has a higher band gap than both said p-type $Ga_{1-X_2}Al_{X_2}As$ layer and said p-type $Ga_{1-X_3}Al_{X_3}As$ layer to form a high potential barrier.

5. A multiple wavelength light emitting device having a single p-n junction comprising:
- at least two p-type light emitting layers respectively having a different band gap within a minority carrier diffusion region;
- a p-type layer adjacent to one end surface of said light emitting layers; and
- an n-type layer adjacent to the other end surface of said light emitting layers.

6. A multiple wavelength light emitting device according to claim 5, wherein said p-type layer has a band gap to form a high potential barrier for preventing electrons injected in said light emitting layers from diffusing.

7. A multiple wavelength light emitting device according to claim 6, which requires a single forward direction bias current.

8. A multiple wavelength light emitting device according to claim 7, wherein said light emitting layers simultaneously emit a visible light and an infrared light, respectively.

9. A multiple light emitting device having a single p-n junction manufactured by a process comprising the steps of:
- preparing a GaAs mono-crystal substrate;
- epitaxially growing a p-type $Ga_{1-X_1}Al_{X_1}As$ layer, a p-type $Ga_{1-X_2}Al_{X_2}As$ layer, a p-type $Ga_{1-X_3}Al_{X_3}As$ layer and an n-type $Ga_{1-Y}Al_YAs$ layer sequentially on said GaAs mono-crystal substrate; and
- removing said GaAs mono-crystal substrate after said epitaxial growth step has been completed.

* * * * *